(12) United States Patent
Carreau

(10) Patent No.: US 8,334,206 B2
(45) Date of Patent: Dec. 18, 2012

(54) METHOD FOR PRODUCING METALLIC INTERCONNECT LINES

(75) Inventor: Vincent Carreau, Fontenay Sous Bois (FR)

(73) Assignee: Commissariat a l'Energie Atomique, Paris (FR)

( * ) Notice: Subject to any disclaimer, the term of this patent is extended or adjusted under 35 U.S.C. 154(b) by 200 days.

(21) Appl. No.: 12/718,587

(22) Filed: Mar. 5, 2010

(65) Prior Publication Data

US 2010/0224999 A1    Sep. 9, 2010

(30) Foreign Application Priority Data

Mar. 6, 2009  (FR) ...................................... 09 51436

(51) Int. Cl.
*H01L 21/44* (2006.01)
(52) U.S. Cl. ........ 438/659; 438/618; 438/620; 438/637; 438/648; 438/689; 257/E23.15; 257/E23.151
(58) Field of Classification Search .................. 257/767, 257/774, E23.154, E23.155, E23.156, E23.15, 257/E23.151; 438/618, 620, 629, 667, 689, 438/637, 648, 659
See application file for complete search history.

(56) References Cited

U.S. PATENT DOCUMENTS

| 6,500,749 | B1 | 12/2002 | Liu et al. | |
|---|---|---|---|---|
| 7,452,812 | B2 * | 11/2008 | Beyer et al. | 438/687 |
| 7,875,977 | B2 * | 1/2011 | Barth et al. | 257/751 |
| 8,039,395 | B2 * | 10/2011 | Meyer et al. | 438/687 |
| 2005/0003654 | A1 | 1/2005 | Horikoshi et al. | |
| 2008/0211098 | A1 | 9/2008 | Suzuki et al. | |

OTHER PUBLICATIONS

R. Spolenak, et al., "Reversible orientation-biased grain growth in thin metal films induced by a focused ion beam", Scripta Materialia, Dec. 1, 2005, pp. 1291-1296, vol. 53.
V. Carreau, et al., "Evolution of Cu microstructure and resistivity during thermal treatment of damascene line: Influence of line width and temperature", Microelectronic.
V. Carreau, et al., "Cu grain growth in interconnects trenches—Experimental characterization of the overburden effect", Microelectronic Engineering, Oct. 2008, pp. 2133-2136.

\* cited by examiner

*Primary Examiner* — Jasmine Clark
(74) *Attorney, Agent, or Firm* — LaRiviere, Grubman & Payne, LLP

(57) ABSTRACT

The invention relates to a method for producing metallic interconnect lines on the surface of a substrate comprising:
  an etching step for defining trenches within said substrate;
  a step for filling said trenches using electrodeposition of a metal exhibiting a crystalline lattice, further comprising the production of a so-called metal invasion layer, on top of said trenches filled with grains of metal so as to define said interconnect lines, characterized in that it also comprises the following steps:
  determination of a first direction ($D_1$) of orientation of grains along a trench and of a second direction ($D_2$) of orientation of grains in a direction perpendicular to a trench;
  determination of a third direction ($D_3$) of ion channelling in the crystalline lattice of said metal;
  determination of at least one direction of orientation ($Di_1$, $Di_2$, $Di_3$) of an ion implantation beam in said metal invasion layer, by performing the scalar products:
    of a first vector relative to said first direction ($D_1$, <110>) and of a third vector relative to said third direction ($D_3$, <110>);
    of a second vector relative to said second direction ($D_2$, <111>) and of the third vector relative to said third direction ($D_3$, <110>);
  the ion implantation of the so-called invasion layer by an ion beam according to one of the previously defined orientations of the ion implantation beam ($Di_1$, $Di_2$, $Di_3$).

10 Claims, 5 Drawing Sheets

METHOD FOR PRODUCING METALLIC INTERCONNECT LINES

PRIORITY CLAIM

This application claims priority to French Patent Application Number 09 51436, Method for Producing Metallic Interconnect Lines, filed on Mar. 6, 2009.

The field of the invention is that of metallic interconnects used in integrated circuits.

BACKGROUND OF THE INVENTION

Generally, the choice of the metallic material is linked to the resistivity of the metal which is one of the key characteristics in the choice of electrical interconnects. In practice, the resistivity acts on at least three parameters which are the signal propagation time, voltage drop and heating by Joule effect. A low resistivity of the conductors is therefore an essential parameter in choosing the materials used.

Copper is one of the solid metals, with silver, that exhibits the lowest electrical resistivity. This is one of the reasons, with the resistance to the electromigration phenomenon, for which it is currently used in very high density integration.

Nevertheless, the copper interconnects come up against two kinds of problems which are that copper is difficult to etch and that it exhibits a high capability for diffusion into numerous materials. This diffusion can lead to the short-circuiting of adjacent tracks, and therefore to an overall circuit malfunction.

The Damascene method described hereinbelow and illustrated in FIG. 1 was developed to overcome these two drawbacks.

It relies notably on a succession of steps which are the following: deposition of a layer of inter-level insulating dielectric, etching of the interconnect patterns, consisting of the lines and vias in the dielectric layer, notably by reactive ion etching (commonly abbreviated RIE), deposition of a barrier layer in the dielectric, used to prevent the migration of the copper, filling of the lines and vias with the copper, elimination of the excess copper by mechanical/chemical polishing.

The copper deposit is produced by electrodeposition, a method that offers good performance in terms of deposit quality, by allowing an effective filling of the trenches. This method can, for example, be based on galvanic copper deposition from a bath containing notably copper sulphate ($CuSO_4$) and additives.

The various steps of this method are illustrated in FIG. 1.

More specifically, after the deposition of an encapsulation dielectric 10, on a first level of interconnects $N_1$, corresponding to the step 1a, trenches Ti are produced by etching in places intended for the production of the interconnects (step 1b) within a substrate S made of dielectrics; a diffusion barrier 11 then a conductive layer 12 are deposited on the surface of the trenches (step 1c) in order to allow the filling of the trenches with the copper Cu by electrochemistry (step 1d). After a bake step, the excess copper on the surface is removed in a mechanical-chemical polishing operation (step 1e), this latter operation commonly being called CMP.

The CMP method is a method of smoothing and planarizing surfaces which combines chemical and mechanical actions, using a chemical etching and mechanical polishing with free abrasive mixture. Mechanical lapping alone causes too much damage on the surfaces and wet etching alone does not yield good planarization. Since the chemical reactions are isotropic, they attack the materials without distinction in all directions. The CMP method combines the two effects at the same time.

However, in environments of small dimensions, typically less than a few hundreds of nanometers (approximately 200 nm), the properties of the copper change. Thus, the resistivity of the copper increases when the line width decreases as described in the article by W. Steinhoegl, G. Schindler and M. Engelhardt, entitled "Unraveling the mysteries behind size effects in metallization systems", *Semiconductor International*, January 2005.

In this respect, FIG. 2 illustrates the trend of the resistivity of copper lines according to the line width corresponding to the width of the trenches, obtained using the Damascene method.

A number of factors must be taken into account. First of all, to avoid the formation of cavities in the lines, the use of additives during the electrochemical growth of the copper is necessary. These additives can be incorporated in the copper in the form of impurities on deposition and thus modify its properties. However, the main factors behind this trend in resistivity are linked to the geometry of the lines, notably their dimensions. It appears that the grain size of a material is limited by the confinement, the smallest dimension of the medium. This phenomenon is notably described in the article by Q-T. Jiang, M. Nowell; B. Foran, A. Frank, R. H. Haveman, V. Parihan, R. A. Augur and J. D. Luttmer, entitled "Analysis of copper grains in damascene trenches after rapid thermal processing or furnace anneals", *Journal of Electronic Materials* 31(1): 10-15, January 2002.

Thus, in narrow lines, the grain size becomes of the order of magnitude of the average free path of the electrons in the solid copper (i.e. 38 nm at 300 K). The electrons then have a tendency to diffuse over the grain joints, through the passage of current.

Furthermore, for small line sizes (typically less than 100 nm wide), a small grain size is a cause that aggravates the phenomena associated with electromigration that reduce the life of the interconnects, the grain joints being possible atom diffusion paths, as described in the article by Changsunp Ryu, Kee-Won Kwon, Alvib L. S. Loke, Haebum Lee, Takeshi Nogami, Valery M. Dubin, Rahim A. Kavari, Gary W. Ray, and S. Simon Wong, IEEE TRANSACTIONS ON ELECTRON DEVICES, 46 (6) (1999), 1113-1120.

The microstructure of the copper is linked to the technological method used for its integration, and typically according to the Damascene method, the grain size after the electrochemical deposition is small. A grain growth bake is applied and during this bake, the surplus copper is still present.

The grain growth mechanism is carried out according to the scheme illustrated in FIG. 3. The step 3a relates to the phase just after the electrochemical deposition in which the grains are small.

In addition to growth of the grains in the line, an invasion of the grains from the excess thickness into the trench is observed, as illustrated in step 3b, and this mechanism can be extended to a total invasion of the trench as illustrated in step 3c.

It has been shown that the extent of this mechanism depends on the bake temperature and on the dimensions: "Cu grain growth in interconnects trenches—Experimental characterization of the overburden effect" Carreau V., Maitrejean S., Brechet Y., Verdier M., Boucu D., Passemard G., *Microelectronic Engineering*, Volume 85, Issue 10, October 2008, pages 2133-2136.

Thus, for bakes at 150 degrees, a limit invasion depth has been determined according to the width of the line as shown by the curve in FIG. 4 which illustrates the invasion depth as a function of the trench width for copper lines baked at 150° C., for 6 hours. This limit depth decreases when the line width decreases.

However, it has also been shown that this growth mechanism makes it possible to obtain a larger grain size in the lines.

An alternative solution to the thermal bake for obtaining large grains is ion implantation. This method uses the density of crystalline defects as the driving force in the movement of grain joints.

The copper grains which have a greater density of defects are consumed to the detriment of the grains that have fewer defects. Given a constant volume, the number of grains decreases so that their average size increases.

Under the impact of an ion beam, crystalline defects appear in a material according to the crystalline orientation of the latter. Two grain populations must then be distinguished: the grains that are oriented so as to channel the incident ions and the others as described in the article by R. Spolenak, L. Sauter, C. Eberl, entitled "Reversible orientation-biased grain growth in thin metal films induced by a focused ion beam", *Scripta Materiala*, 53, 1291-1296, 2005.

The grains that channel the ions grow at the expense of the grains that do not channel the incident ions as illustrated in FIG. 5. Under the action of an ion implantation flux Fi, the grains that channel the ions referenced Gci can grow at the expense of the grains that do not channel the ions, situated at the periphery of the grain Gci.

The feasibility of this technique has been demonstrated by the ion implantation of $Ga^+$ ions (R. Spolenak, L. Sauter, C. Eberl, Reversible orientation-biased grain growth in thin metal films induced by a focused ion beam, *Scripta Materiala*, 53, 1291-1296, 2005) and $Ar^+$ ions (S. Olliges, P. Gruber, A. Bardill, D. Ehrler, H. D. Cartanjen, R. Spolenak, Converting polycrystals into single crystal-selective grain growth by high-energy ion bombardment, *Acta Materiala*, 54, 5393-5300, 2006) in thin films. The effects of the ion implantation on the grain size can be detected up to depths of approximately 500 nm.

Generally, the growth of the copper layer is polycrystalline. The concept of grain joints is defined by the interface between two crystalline domains in a polycrystalline structure.

The size of the grains depends on the surface of the substrate, the growth conditions and the dimensions of the trenches.

Results of crystalline orientation measurements in structures of Damascene type show that the grains deriving from the invasion of the excess thickness have an orientation that is different from those deriving from the growth in the connect line, as is described in the article by B. Kaouache, S. Labat, O. Thomas, S. Maitrejean, V. Carreau: "Texture and strain in narrow copper damascene interconnect lines: An X-ray diffraction analysis" *Microelectronic Engineering*, Volume 85, Issue 10, October 2008, pages 2175-2178.

The grains deriving from the growth in the line are oriented with a direction <111> perpendicular to the substrate and a direction <110> in the direction of the line.

The grains deriving from the invasion show a direction <001> perpendicular to the substrate.

SUMMARY OF THE INVENTION

The subject of the present invention is a method making it possible to optimize the resistance to electromigration by reducing the number of grain joints in the section of the trench and do so by optimizing the crystalline direction to be favoured at the level of the metallic excess thickness on top of the trench.

More specifically, the subject of the invention is a method for producing metallic interconnect lines on the surface of a substrate comprising:
  an etching step for defining trenches within said substrate;
  a step for filling said trenches using electrodeposition of a metal exhibiting a crystalline lattice, further comprising the production of a so-called metal invasion layer, on top of said trenches filled with grains of metal so as to define said interconnect lines, characterized in that it also comprises the following steps:
  determination of a first direction of orientation of grains along a trench and of a second direction of orientation of grains in a direction perpendicular to a trench;
  determination of a third direction of ion channelling in the crystalline lattice of said metal;
  determination of at least one direction of orientation of an ion implantation beam in said metal invasion layer, by performing the scalar products:
    of a first vector relative to said first direction and of a third vector relative to said third direction;
    of a second vector relative to said second direction and of the third vector relative to said third direction;
  the ion implantation of the so-called invasion layer by an ion beam according to one of the previously defined orientations of the ion implantation beam.

According to a variant of the invention, the thickness of the invasion layer exhibits an initial thickness that is at least equal to the height of a trench.

According to a variant of the invention, the determination of the first and the second directions of orientation of the grains in a trench further comprises:
  after the electrochemical deposition, the removal of an excess thickness layer so as to release the metal deposit inside a trench;
  a bake operation at a temperature making it possible to stabilize the microstructure obtained from the metal deposit inside a trench;
  an X-ray diffraction analysis making it possible to identify said first direction of orientation of the grains in the trench.

According to a variant of the invention, the metal being copper, and the lines having a width less than approximately 200 nm, the first direction is defined by the crystallographic set <110>, the second direction is defined by the crystallographic set <111>, the direction of channelling is defined by the crystallographic set <110> within the face-centred cubic lattice of the copper, the directions of orientation of an ion implantation beam form an angle of the order of 35° with the direction <111>.

According to a variant of the invention, the metal being copper, the ion implantation is performed with ions of $Ga^+$ type.

According to a variant of the invention, the ion implantation is performed by a beam of ion power generated with an acceleration voltage less than or equal to approximately 300 kV.

According to a variant of the invention, the method also comprises a bake step subsequent to the ion implantation step.

According to a variant of the invention, the method also comprises a step for a first polishing making it possible to optimize the thickness of the so-called invasion layer by thickness reduction, prior to the ion implantation operation, according to the line width.

According to a variant of the invention, the method also comprises the deposition of a metallic layer on the surface of said trenches so as to avoid any metal diffusion within said trenches.

Advantageously, the metallic layer is made of metal of tantalum or tantalum nitride type.

The invention will be better understood and other benefits will become apparent from reading the following description, given by way of nonlimiting example, and from the appended figures in which:

DESCRIPTION OF THE INVENTION

Figure 6:
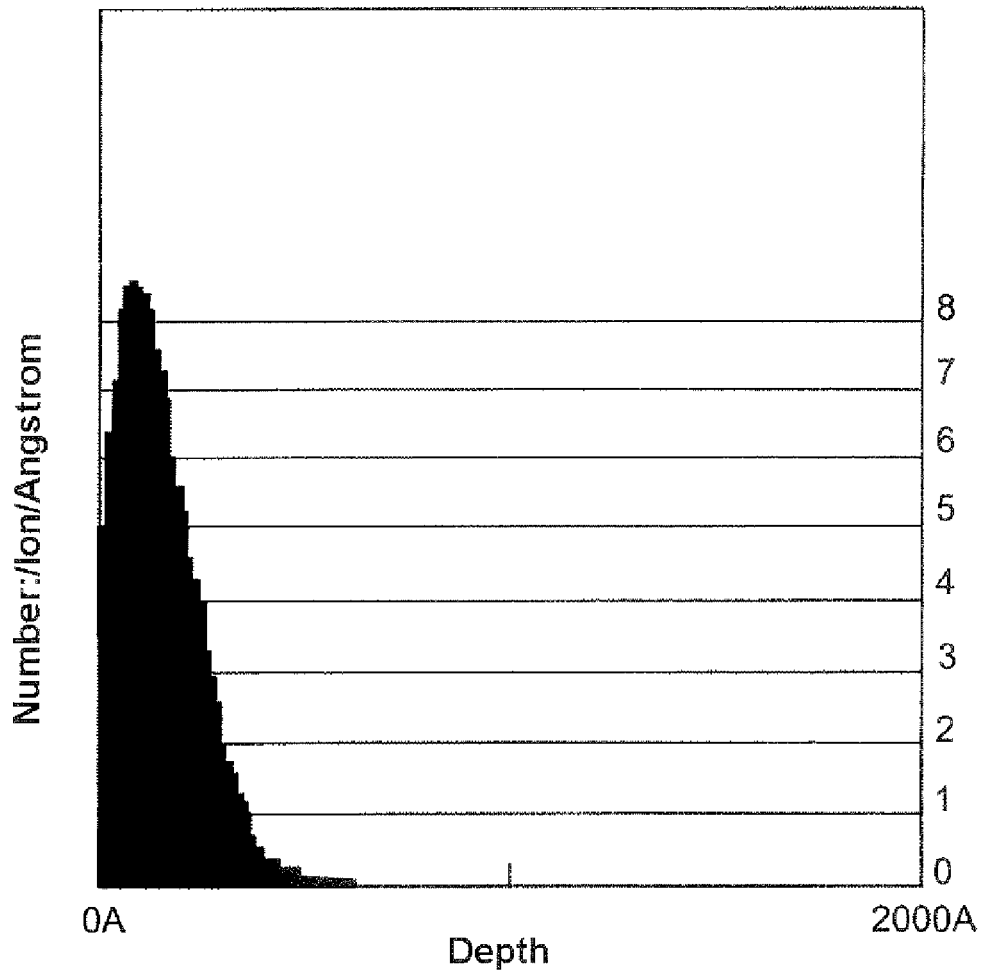
FIG. 6 illustrates the result of an SRIM simulation of defects created by the implantation of Cu ions in copper with an energy of 70 kV.

According to the invention, it is proposed to put into practice a grain growth assisted by ion implantation in the surplus metal on the surface of the substrate that also serves as protection for the so-called interline dielectric from the implanted species. The implanted species are limited in depth in a given material according to their nature, as is shown by the example of copper ions in copper in FIG. 6.

This figure illustrates the number of defects created by the implantation of copper ions in the copper with an energy of 70 kV, according to the penetration depth. These results are derived from a program for calculating and simulating the energy loss of the cores in various materials, developed by J. F. Ziegler (J. P. Biersack and L. Haggmark, Nucl. Instr. and Meth., vol. 174, 257, 1980, J. F. Ziegler: "*The Stopping and Range of Ions in Matter*", volumes 2-6, Pergamon Press, 1977-1985), the "SRIM" program.

A significant improvement in the invasion phenomenon is thus made possible by orienting the grains of the excess thickness according to the natural orientation of the grains in the lines, and the friction phenomenon limiting the invasion is also reduced thereby.

The invention is described hereinbelow in the context of interconnect lines produced in copper but could also be applied in the context of another metal of aluminium or silver type.

The copper crystallizes in a face-centred cubic lattice and exhibits a preferred direction of ion channelling $D_3$ corresponding to the direction <110>.

Moreover, as described previously, the preferred direction of orientation $D_1$ of the grains along the line is also defined by the direction <110>.

The directions of ion implantation are thus defined by the scalar product of $D_1$ or $D_3$ with $D_2$, or the scalar product of <110> by <111>.

According to the invention, it is proposed to determine the angle with which a silicon substrate should be disoriented so as to bring into line a previously determined favourable direction <110> and the direction of the incident ion beam.

To do this, a set of favourable directions <110> is determined, for which the angle relative to the normal to the substrate is determined. With the orientations previously given, the lines must be oriented at an angle of 35° relative to the direction of implantation as shown in FIG. 7.

Figure 7A:
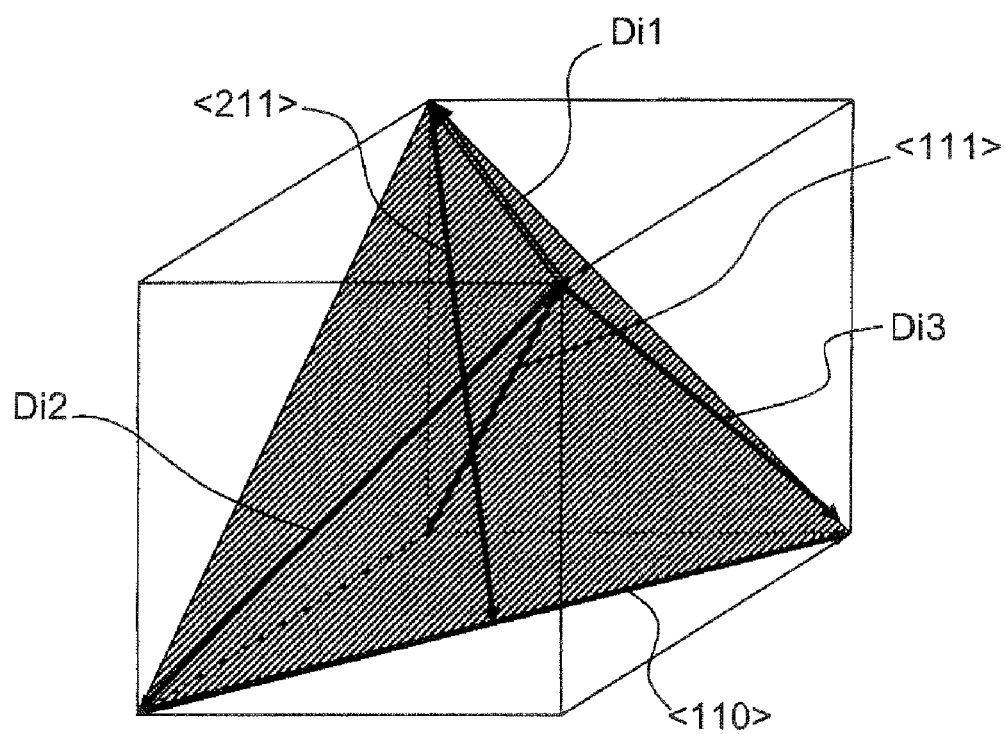
FIGS. 7a and 7b respectively illustrate a view of a face-centred cubic lattice of copper and a diagrammatic representation of a copper line with a preferred direction of orientation of the ion implantation beam.

More specifically, FIG. 7a illustrates a view of a cubic lattice with these three directions. Three directions of ion implantation that are favourable and meet the criterion of the scalar product of <111> by <110> are identified $Di_1$, $Di_2$ and $Di_3$.

Figure 7B:
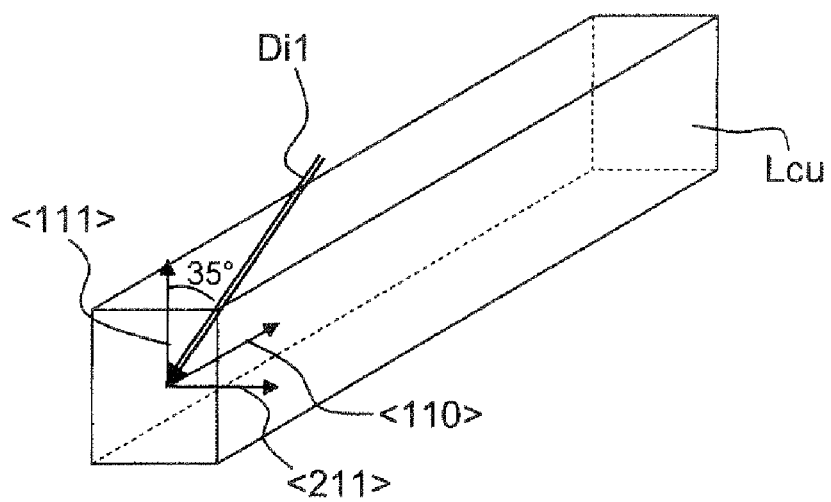

FIG. 7b illustrates a diagrammatic representation of a copper interconnect line $L_{cu}$, with the three crystalline directions identified, the direction <110> at the core of the line, the perpendicular direction <111> and the direction <211> that are perpendicular to the previous two, on which the direction $Di_1$ is also represented.

These directions $Di_1$, $Di_2$ and $Di_3$ form an angle of 35° with the perpendicular to the plane of the lines and correspond to the optimized directions of ion implantation.

In practice, the ion implantation is carried out when a copper layer is situated above the line. This layer is derived from the electrochemical deposition of the copper from the Damascene method described previously.

The initial thickness of this layer is at least equal to the depth of the trenches.

There now follows a description hereinbelow of the various steps of an exemplary method according to the invention making it possible to produce interconnect lines of optimized resistivity.

Figure 1:
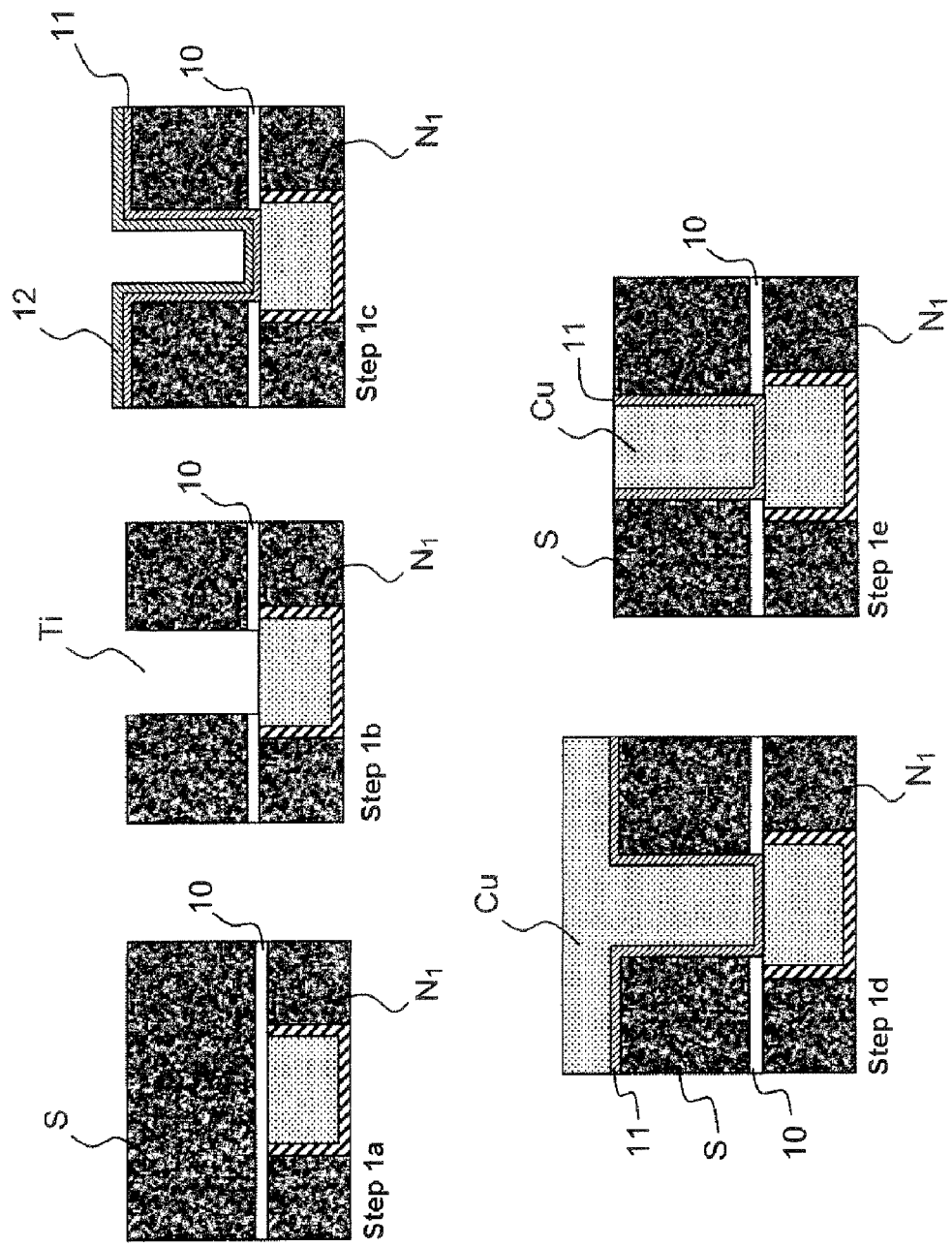
FIG. 1 illustrates the various steps of a Damascene-type method according to the prior art making it possible to produce copper interconnect lines.
Figure 2:
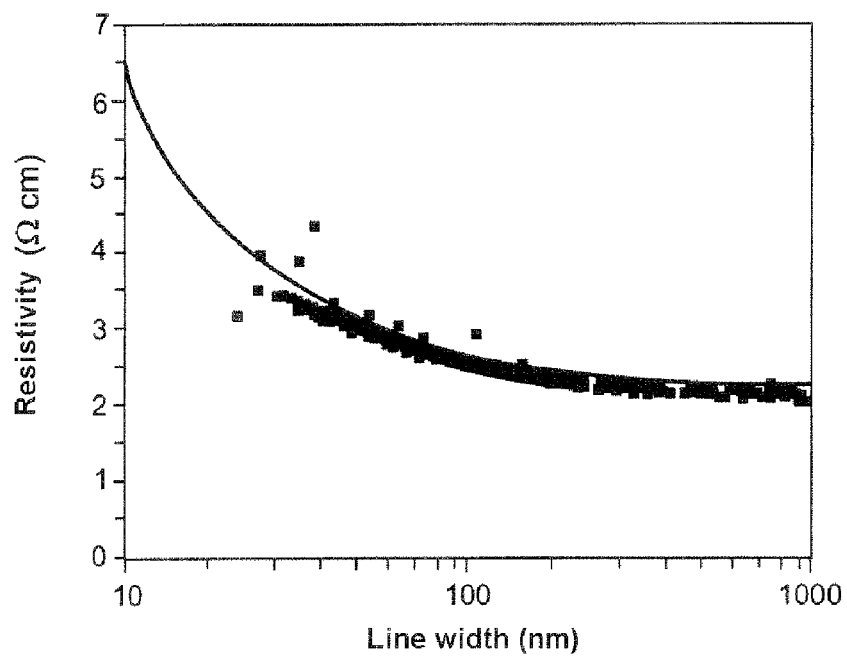
FIG. 2 illustrates the trend of the resistivity of interconnect lines obtained by a Damascene-type method according to their width.
Figure 3:
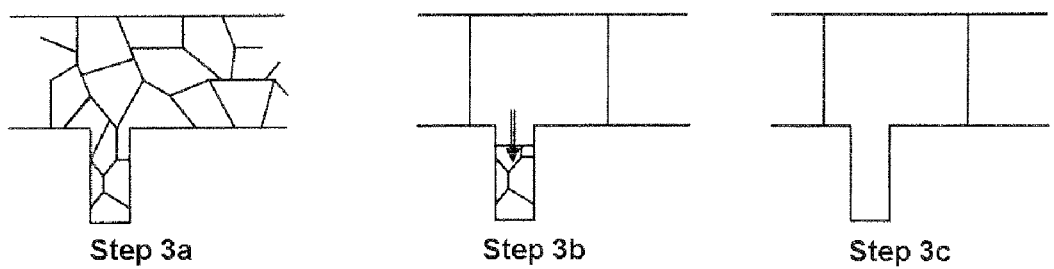
FIG. 3 illustrates the grain growth mechanisms in a structure incorporating a line and surplus copper in a method comprising an ion implantation step according to the prior art.
Figure 4:
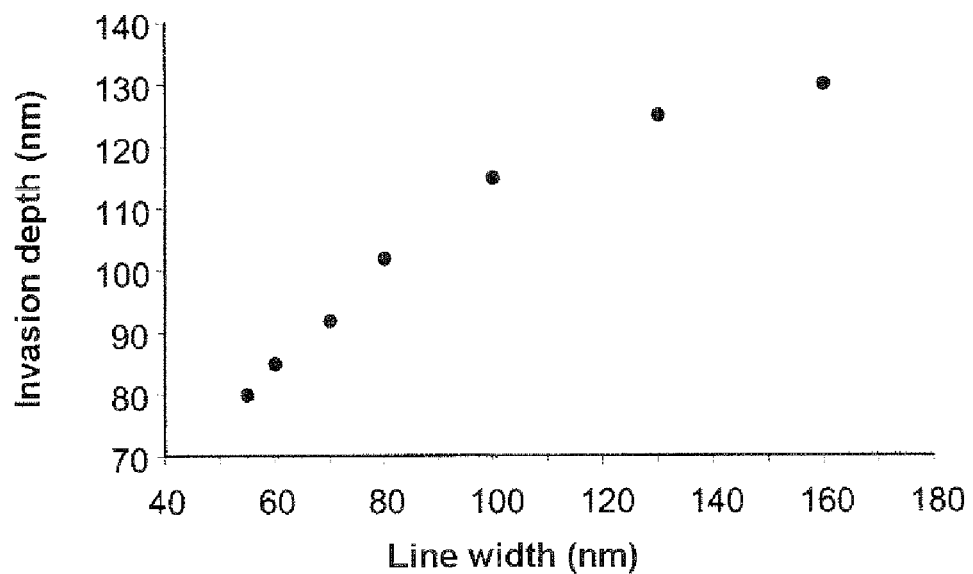
FIG. 4 illustrates the invasion depth according to the trench width for copper lines baked at 150° C. for 6 hours in a method from the prior art.
Figure 5:
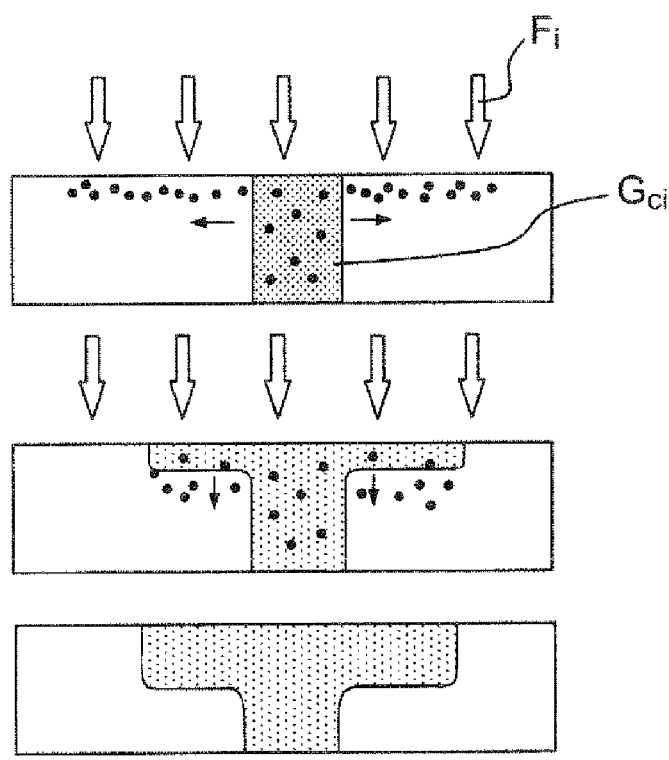
FIG. 5 illustrates the process of propagation of a grain channelling the ions of a thin film.

Step 1: Determining the Preferred Direction D1 of the Grains in the Trenches:

The orientation of the grains that is favoured in the lines only is determined. For this, the excess thickness is removed immediately after the deposition with no bake. The structure obtained is similar to that illustrated in FIG. 1e.

A bake is then applied. The bake temperature lies between the melting temperature divided by four and the melting temperature of the metal. To determine the favoured orientation at a certain bake temperature, a microstructure that is as stable as possible must be obtained. The bake duration is long, at least one hour.

After this treatment, the orientation of the grains in the lines is determined. This analysis can be carried out by X-ray diffraction.

The angle is then determined by which the substrate should be disoriented (relative to a standard direction of implantation), the copper lines resting on the substrate so as to place the direction of implantation in line with a favoured crystallographic direction <110>, according to the method described previously.

Step 2: Determining the Choice of the Species, the Energy and the Dose to be Implanted:

The species to be implanted is chosen. This choice can be freely made from atoms with an atomic number greater than that of the material forming the line.

The implantation operation is carried out in the layer above the lines that is to be removed in a second stage.

The implantation energy is chosen so as to avoid having the incident ions go beyond the top layer of copper. Typically, the acceleration voltage is less than or equal to 300 kV.

Once the species, the energy and the disorientation are known, the method is simulated with the "SRIM" program. The dose is then calculated so that the density of defects present is of the order of $100*10^{23}$ gaps/cm$^3$ created in total in the target material.

An example of ion implantation datum is given hereinbelow: the orientation of copper films 100 nm thick is modified by the ion implantation of gallium ions Ga$^+$ at 30 keV with a dose of $28*10^{15}$ at/cm$^2$.

In these conditions, after the electrochemical copper deposition, a first mechanical-chemical polishing is used to reduce the size of the excess thickness invasion layer until it reaches approximately 150 nm.

Step 3: Technological Implementation:

Once the implantation method is chosen, a simulation is carried out using the "SRIM" program so as to ascertain the depth to which most ions will go by this method. This depth can be used to determine the thickness of the top layer of copper in which the implantation is exercised. The thickness of the layer is determined so as to have the depth at which the greatest concentration of the implanted species is obtained plus 150 nm (+/−100 nm).

After the copper deposition by electrochemistry, a mechanical-chemical polishing is applied that reduces the thickness of the top layer of copper until it reaches the determined thickness.

The implantation is then carried out in the previously determined conditions.

A bake is applied. The bake temperature is the same as that at which the most favourable orientation of the grains of copper was determined.

Once the bake is complete, the excess copper is removed by mechanical-chemical polishing.

The invention claimed is:

1. Method for producing metallic interconnects lines on a surface of a substrate comprising:
   a. etching trenches within the substrate;
   b. filling the trenches using electro deposition of a metal exhibiting a crystalline lattice;
   c. producing a metal invasion layer, having a thickness, on top of the trenches filled with grains of metal so as to define the interconnect lines;
   d. determining a first direction of orientation of grains along a trench and of a second direction ($D_{sub.2}$) of orientation of grains in a direction perpendicular to the trench;
   e. determining a third direction ($D_{sub.3}$) of ion channeling in the crystalline lattice of the metal;
   f. determining at least one direction of orientation ($Di_{sub.1}$, $Di_{sub.2}$, $Di_{sub.3}$) of an ion implantation beam in the metal invasion layer, by performing the scalar products of:
      i. a first vector relative to the first direction ($D_{sub.1}$, <110>) and of a third vector relative to the third direction ($D_{sub.3}$, <110>);
      ii. a second vector relative to the second direction ($D_{sub.2}$, <111>) and of the third vector relative to the third direction ($D_{sub.3}$, 110>); and
   g. implanting the invasion layer by an ion beam according to one of the previously defined orientations of the ion implantation beam ($Di_{sub.1}$, $Di_{sub.2}$, $Di_{sub.3}$).

2. Method for producing metallic interconnect lines according to claim 1, wherein the thickness of the invasion layer exhibits an initial thickness that is at least equal to a height of a trench.

3. Method for producing metallic interconnect lines according to one of claims 1 and 2, wherein determining the first direction of orientation of the grains in a trench further comprises:
   a. after filling the trenches using electro deposition of a metal exhibiting a crystalline lattice, removing an excess thickness layer so as to release any metal deposit inside the trench;
   b. baking the substrate to stabilize the microstructure obtained from the electro deposition of the metal inside the trench;
   c. Conducting an X-ray diffraction analysis to identify the first direction of orientation of the grains in the trench.

4. Method for producing metallic interconnect lines according to claim 1 or 2, wherein the metal being copper, the first direction is defined by the crystallographic set <110>, the second direction being defined by the crystallographic set <111>, the third direction of channeling being defined by the crystallographic set <110> within a face-centered cubic lattice of the copper, the set of the directions of orientation of the ion implantations beam forming an angle of the order of 35 degrees with the direction <111>.

5. Method for producing metallic interconnect lines according to claim or 2, wherein the metal being copper, the ion implantation is performed with ions of Ga.sup.+type.

6. Method for producing metallic interconnect lines according to claim 1 or 2, wherein the ion implantation is performed by a beam of ion power generated with an acceleration voltage less than or equal to approximately 300 kV.

7. Method for producing metallic interconnect lines according to claim 1 or 2, comprising a bake step subsequent to the ion implantation step.

8. Method for producing metallic interconnect lines according to claim 1 or 2, comprising a step for a first polishing making it possible to optimize the thickness of the invasion layer by thickness reduction, prior to the ion implantation operation.

9. Method for producing metallic interconnect lines according to claim 1 or 2, further comprising depositing a metallic layer on the surface of the trenches so as to avoid any metal diffusion within the trenches.

10. Method for producing metallic interconnect lines according to claim 9, wherein the metallic layer is made of metal of tantalum or tantalum nitride type.

* * * * *